United States Patent
Hool et al.

(10) Patent No.: US 6,864,565 B1
(45) Date of Patent: Mar. 8, 2005

(54) POST-PASSIVATION THICK METAL PRE-ROUTING FOR FLIP CHIP PACKAGING

(75) Inventors: Vincent Hool, Fremont, CA (US); Jon Long, Livermore, CA (US)

(73) Assignee: Altera Corporation, San Jose, CA (US)

( * ) Notice: Subject to any disclaimer, the term of this patent is extended or adjusted under 35 U.S.C. 154(b) by 77 days.

(21) Appl. No.: 10/289,842

(22) Filed: Nov. 6, 2002

Related U.S. Application Data

(60) Provisional application No. 60/337,221, filed on Dec. 6, 2001.

(51) Int. Cl.[7] .............................................. H01L 29/72
(52) U.S. Cl. ...................... 257/666; 257/678; 257/686; 257/690; 257/700; 257/738; 257/778; 257/780
(58) Field of Search ................................ 257/666, 678, 257/686, 696, 700, 738, 778, 780, 789

(56) References Cited

U.S. PATENT DOCUMENTS 6,407,459 B2 * 6/2002 Kwon et al. ................ 257/780
2001/0048591 A1 * 12/2001 Fjelstad et al. ............. 257/778

OTHER PUBLICATIONS www.national.com, National Semiconductor Application Note 1126, "BGA (Ball Grid Array)" Dec. 2000, ©2000 National Semiconductor Corporation AN101094.

Intel Technical Notes "Thermal, Electrical and Mechanical Considerations in Applying BGA Technology to a Design", Dec. 8, 1997, Revision 1.0.

Blankenhorn and Oppert, "A Semi–Additive Electroless Ni/Au Process Offers a Low–Cost Wafer–Bumping Method", www.chipscalereview.com/issues/0701/techForum01_01.html last visited Oct. 5, 2001.

"Advanced Package Designer High–density IC package design", www.pcb.cadence.com/pcb/ic/APD.asp last visited Oct. 5, 2001.

* cited by examiner

*Primary Examiner*—Edward Wojciechowicz
(74) *Attorney, Agent, or Firm*—Morgan, Lewis & Bockius LLP

(57) ABSTRACT

The present invention includes a semiconductor package and a method of making the semiconductor package. The semiconductor package comprises an IC chip and a substrate, wherein part of the substrate routing such as substrate level trace routing is placed on the IC chip using post-passivation thick metal process at wafer level.

23 Claims, 7 Drawing Sheets

POST-PASSIVATION THICK METAL PRE-ROUTING FOR FLIP CHIP PACKAGING

This application claims the benefit of provisional application No. 60/337,221, filed Dec. 6, 2001.

The present invention relates generally to semiconductor packaging technology, and particularly to flip chip packaging technology.

BACKGROUND OF THE INVENTION

Flip chip packaging technology has found wide-spread use because of its advantage in size, performance, flexibility, reliability and cost over other packaging methods. Flip chip packaging employs direct electrical connection of face-down integrated circuit (IC) chips onto substrates, circuit boards, or carriers, by means of conductive bumps on the chip bond pads, replacing older wire bonding technology where face-up chips sit on substrates with wire connection to each bond pad. Many of the flip chip bumping techniques developed in recent years have focused on realizing bumps or solderable metallizations directly on the peripheral bond pads of a semiconductor chip. Solder bumping by screen printing solder paste can be used for chip I/O pitches down to 200 micron. However, with increasing IC complexity, the IC pin count has also increased drastically, so that if only peripheral pads were used, pitches that are less than 60 micron would be necessary. Therefore, in order to package these IC chips using flip-chip technology, the peripheral I/O pads are usually redistributed into area array pads with larger pads and a relaxed pitch. Such redistribution is typically accomplished by physically connecting the peripheral pads to the area array pads using conducting leads formed on the semiconductor chip.

Redistribution of I/O pads for flip chip packaging typically involves several process steps such as: (1) Ni/Au bumping of peripheral bond pads; (2) spinning of dielectric layer; (3) photo imaging for opening of Ni/Au bond pads; (4) formation of seed layer; (5) full area copper deposition; (6) photo masking for defining the redistribution lines; (7) copper etching; (8) spinning of solder masks and photo imaging for opening of redistributed pads; (9) Ni/Au bumping of redistributed pads; and (10) solder stencil printing. A cross-sectional view of a redistributed bump pad is shown in FIG. 1.

During flip chip packaging, the IC chip with bump array is placed face-down on a substrate with a matching bump array, and the assembly is heated to make a solder connection. The solder bumps in the matching bump array on the substrate are routed to a ball grid array (BGA) attached to the substrate via connection lines in the substrate. With the increasing density of the bump array, customized substrates with multilayered routing are typically used for today's flip chip ICs in order to fan-out all traces of the connection lines. FIG. 2 illustrates a portion of a flip-chip package of an IC chip with redistributed bump arrays. The bump array are placed on matching bump pads on a top side of the substrate. The matching bump pads are then connected to substrate BGA pads for attaching the BGA on a bottom side of the substrate via six layers of routing lines and vias that couple between these layers. The six layers of routing lines include two layers of signal trace lines L1 and L2, one $V_{SS}$ plane, one $V_{CC}$ plane, one $V_{CCN}$ plane, and one BGA land layer. The substrate unit cost increases drastically due to the additional layer count and advanced design rules to lay out the substrate routing lines. Therefore, there is a need to reduce substrate unit cost by using standard or semi-standard substrates with fewer routing layers and less stringent design rules.

SUMMARY OF THE INVENTION

In summary, the present invention is a semiconductor package comprising an IC chip and a substrate, wherein part of the substrate routing such as substrate level trace routing is placed on the IC chip using post-passivation thick metal process at wafer level. Therefore, the I/O pads on the IC chip are not only redistributed but are also pre-routed using conductive pre-routing lines on the chip for the purpose of reducing the number of routing layers on the substrate. The pre-routing lines are made of post-passivation metal that is sufficiently thick so that the resistance and inductance associated with the pre-routing lines are sufficiently small and the performance of the IC chip is not affected. Depending on the density of the pads on the IC chip, multiple layers of pre-routing lines may be required.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 3A:
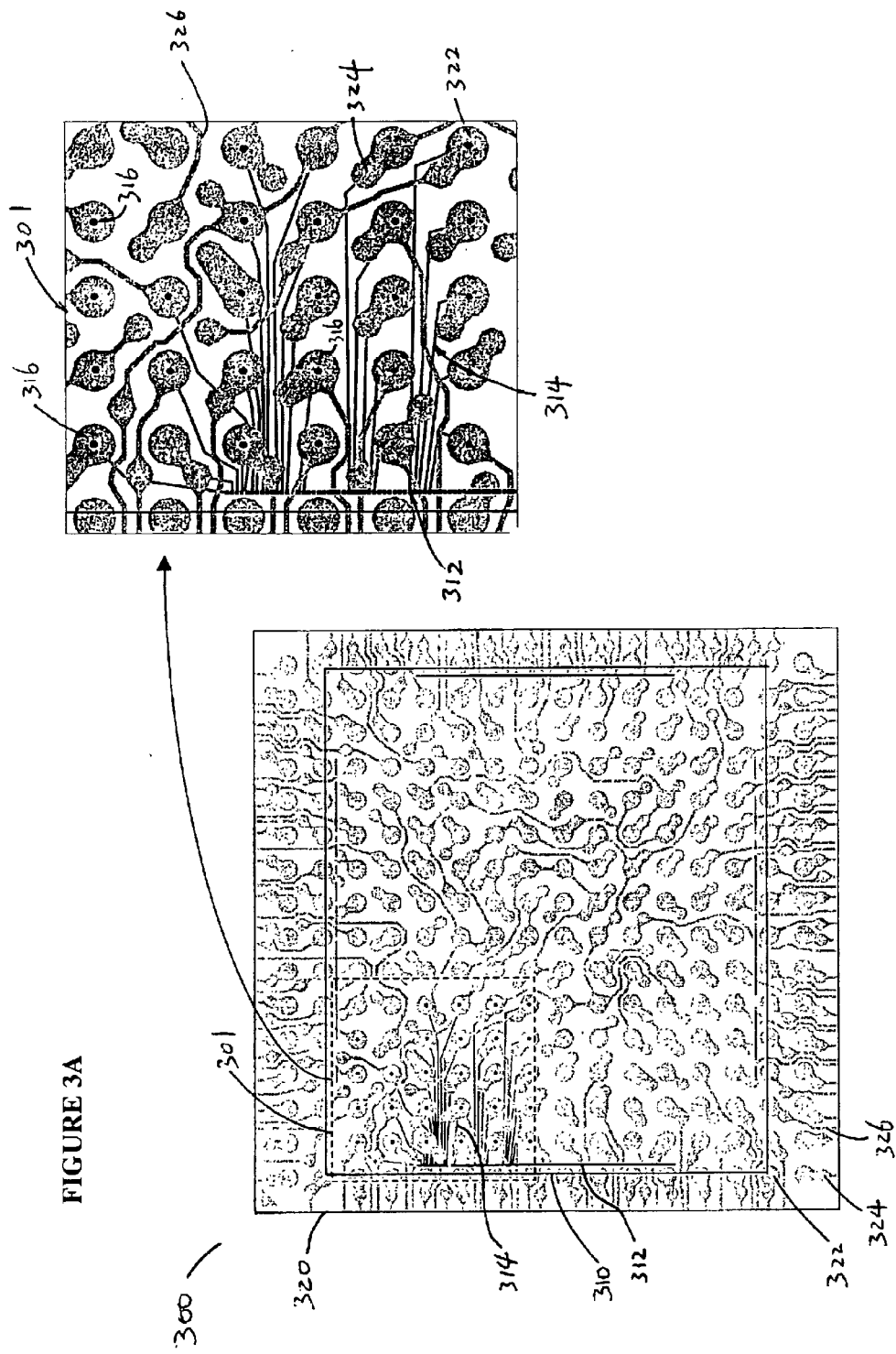
FIG. 3A is a diagram illustrating pre-routing of pads on a semiconductor chip according to one embodiment of the present invention.

FIG. 3A shows a top view of a flip chip package 300, according to one embodiment of the present invention. Package 300 comprises an IC chip 310 placed on a packaging substrate 320, both being made transparent in FIG. 3A to show some of the routing lines in the package. In one embodiment of the present invention, the packaging substrate 320 has a first side with an array of bump pads (not shown) for bonding with the IC chip 310, and a second side with an array of BGA pads 322 for attaching a grid array of solder balls. The packaging substrate 320 also includes multiple layers of metal routing lines, at least one layer of organic dielectric film separating adjacent layers of metal lines, and a plurality of vias 324 providing connections between different layers of metal lines. The vias and metal routing lines provide electrical connections between the IC chip and the ball grid array. For ease of illustration, only a BGA land layer routing lines 326 are shown in FIG. 3A. The BGA land layer routing lines 326 connect the BGA pads 322 with respective vias 324 in the substrate. The layers of metal lines and dielectric film(s) in the substrate 320 may be put together using conventional build-up and/or laminate technologies.

The IC chip 310 can be any IC chip suitable for flip chip packaging and includes a plurality of peripheral pads 312. An example of the IC chip 310 is a programmable logic device that is 17 mm on a side and has 136 pads including $V_{CC}$, $V_{CCN}$, $V_{SS}$, or $V_{SSN}$ pads, and 536 pads including input, output or input/output (I/O) pads. Pre-routing lines 314 are formed on the IC chip 310 to pre-route the plurality of peripheral pads 312 to new locations on the IC chip. For clarity, only a portion the pre-routing lines 314 on chip 310 are shown in FIG. 3A.

In an area defined by a dashed window 301, which is zoomed for easy viewing, pre-routing metal lines 314 on the chip 310 are shown. In one embodiment of the present invention, the new locations 316 for the pre-routed pads are chosen such that the pre-routed pads are farther spaced apart from each other and some of the pads are brought within a predetermined horizontal distance of or as close as possible to the center of the respective vias 324 and/or BGA balls 322 to which they are designed to eventually connect through packaging. In one embodiment of the present invention, the predetermined horizontal distance is less than the size (diameter) of the BGA pads. In another embodiment of the present invention, the predetermined horizontal distance is less than half of the diameter of a BGA pad. Because many of the pads 312 are I/O pads and the pre-routing can go as far as half the width of a chip, the pre-routing lines 314 need to be thick enough so that the pre-routing will not affect the performance of the chip 310. In one embodiment of the present invention, the thickness of the pre-routing metal lines is at least 8 $\mu$m. In another embodiment of the present invention, the thickness of the pre-routing metal lines is at least 10 $\mu$m, and the line/space requirement for the pre-routing lines is about 10($\mu$m)/20($\mu$m).

Figure 1:
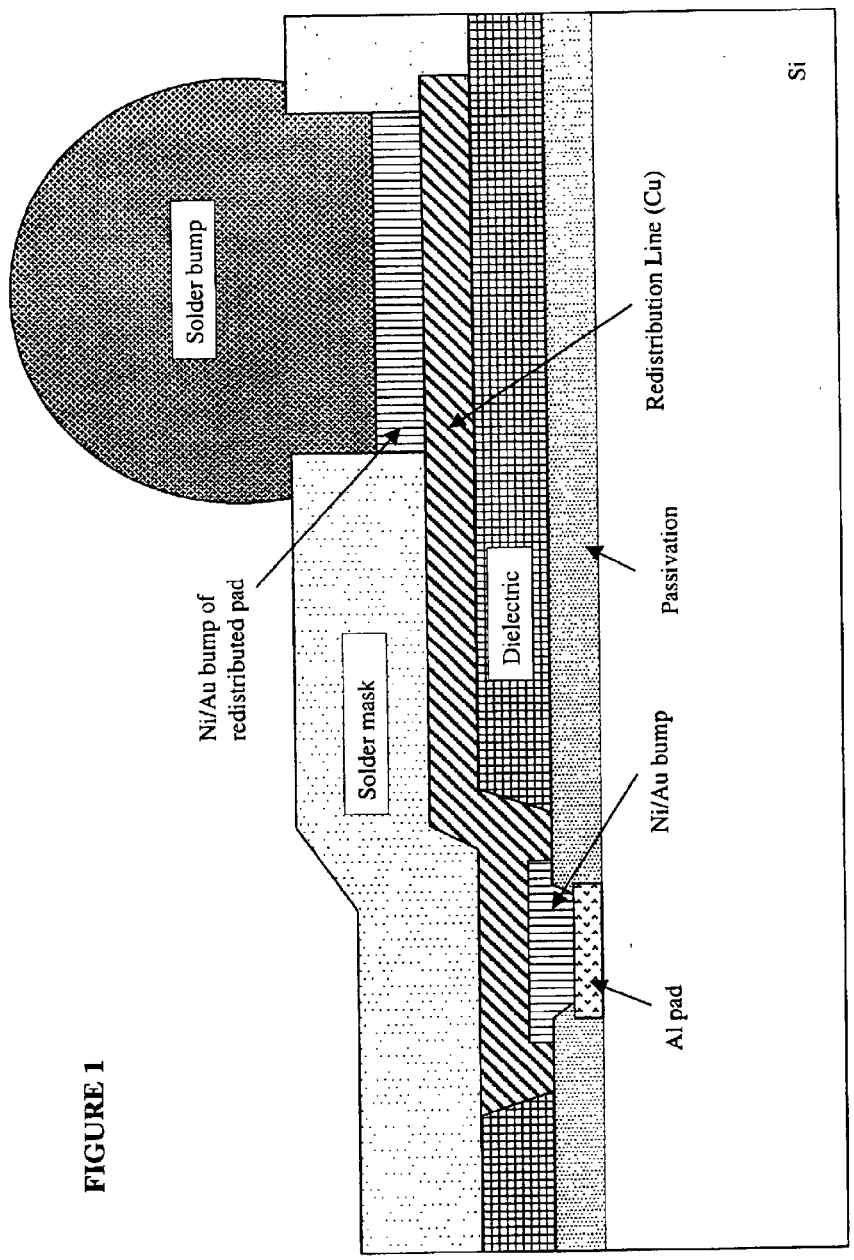
FIG. 1 is a diagram of a cross section of a redistributed pad.
Figure 2:
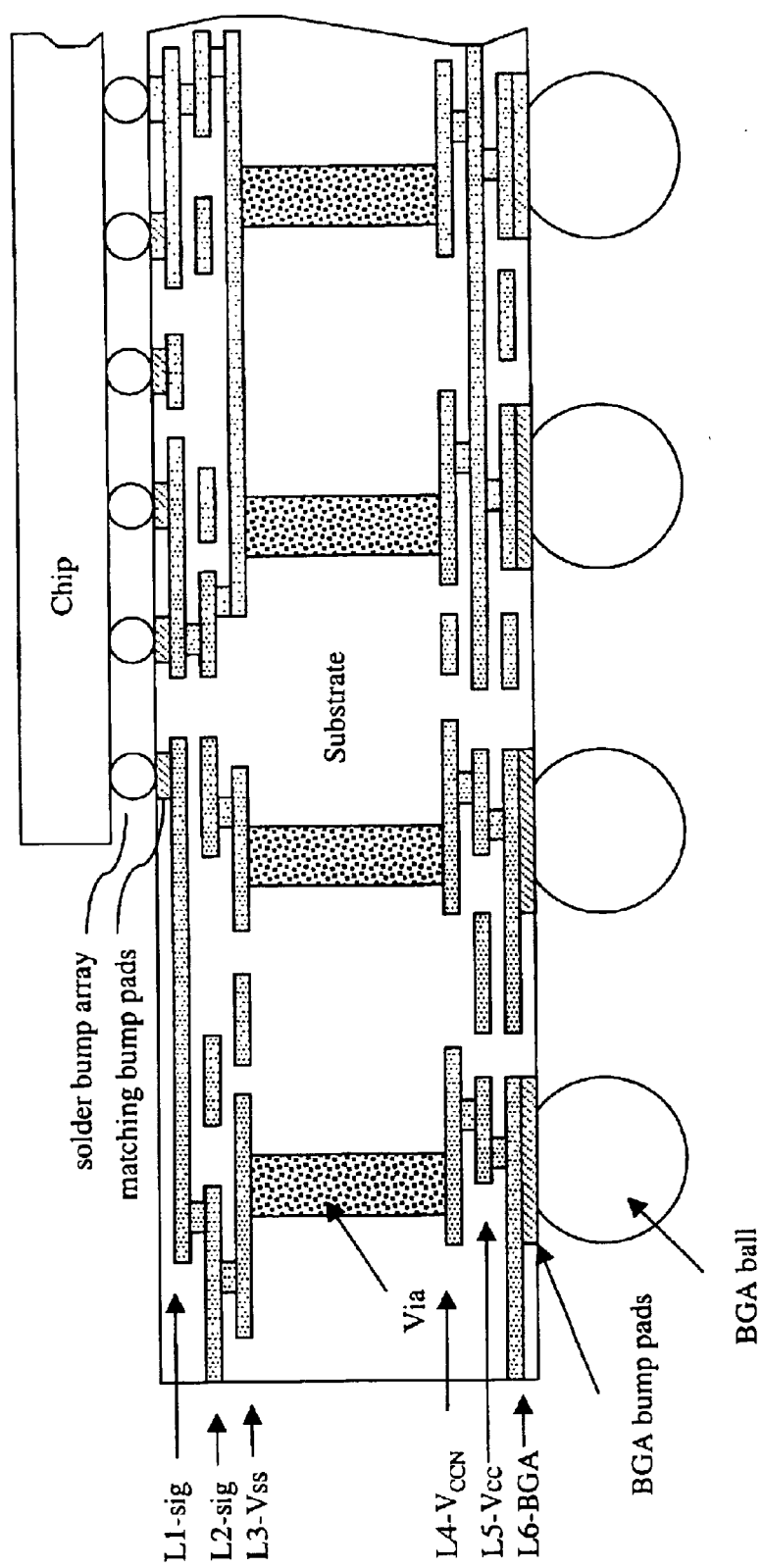
FIG. 2 is a diagram of a flip-chip package including a substrate with six layers of routing lines.
Figure 3B:
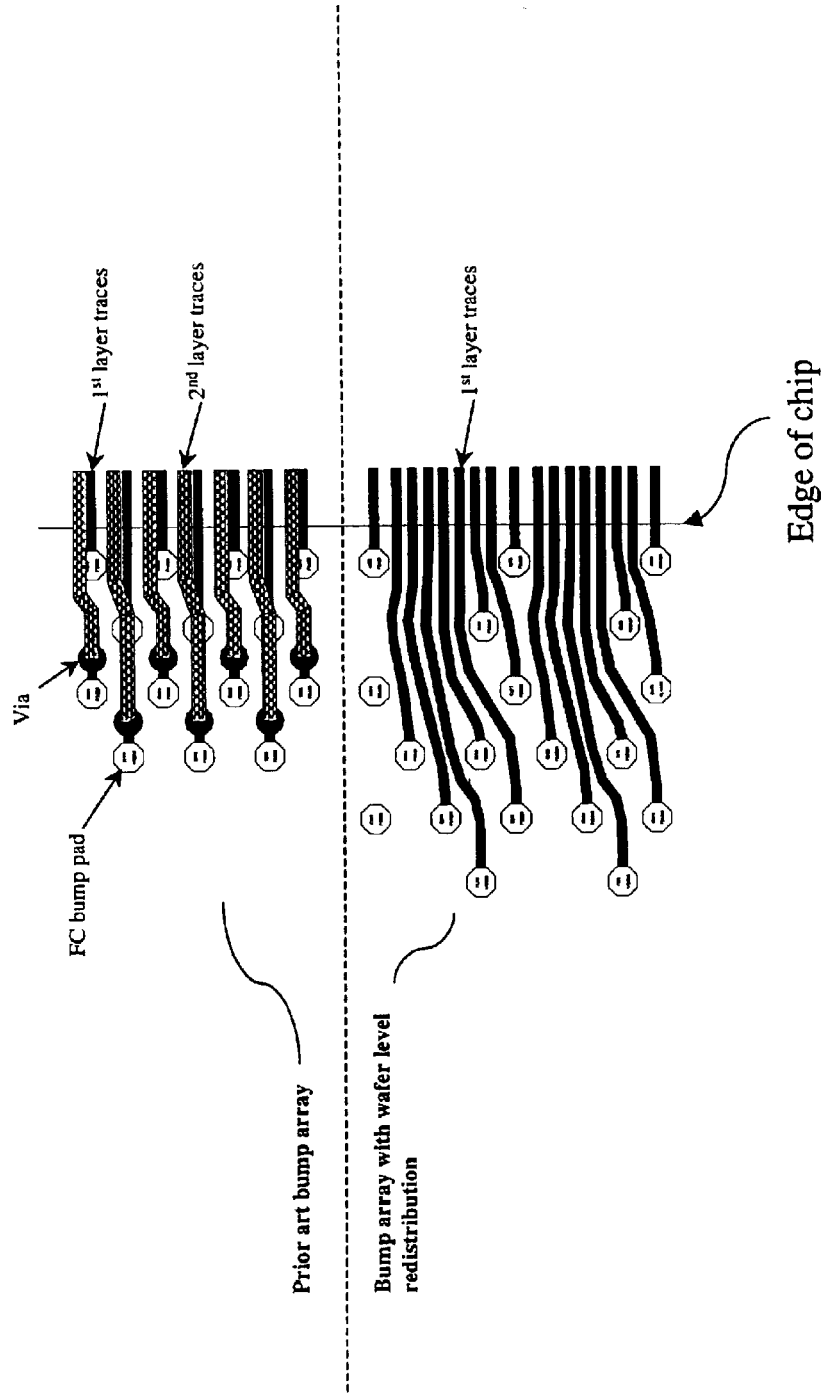
FIG. 3B is a diagram illustrating a reduction of signal trace layer with pre-routing.

As a result of the pre-routing shown in FIG. 3A, one of the two signal layers shown in FIG. 2 is no longer needed. This is illustrated in FIG. 3B, which shows top views of a part of a flip-chip package without pre-routing and a part of a flip-chip package with pre-routing. For clarity, only the bump arrays on the chips and the signal trace layers in the substrates of the flip-chip packages are shown in FIG. 3B. Because the substrates are usually much bigger than the chips, many of the solder bumps in the bump arrays of the chips need to be connected to the BGA pads on the substrates that are beyond the edges of the chips. As shown in FIG. 3B, without pre-routing, two signal trace layers in the substrate are needed to fan out all signal traces that provide connection from the I/O pads or flip-chip (FC) bumps on the chip to the corresponding BGA pads on the package beyond the edge of the chip. With pre-routing, a smaller amount of routing at the signal trace layer is needed because a lot of the FC bumps are placed right on top of the vias or BGA balls which they are designed to connect to and thus do not need to be fanned out beyond the edge of the chip. As a result, only one signal layer is required to fan out the rest of the signal traces to the corresponding BGA pads beyond the edge of the chip.

Figure 4:
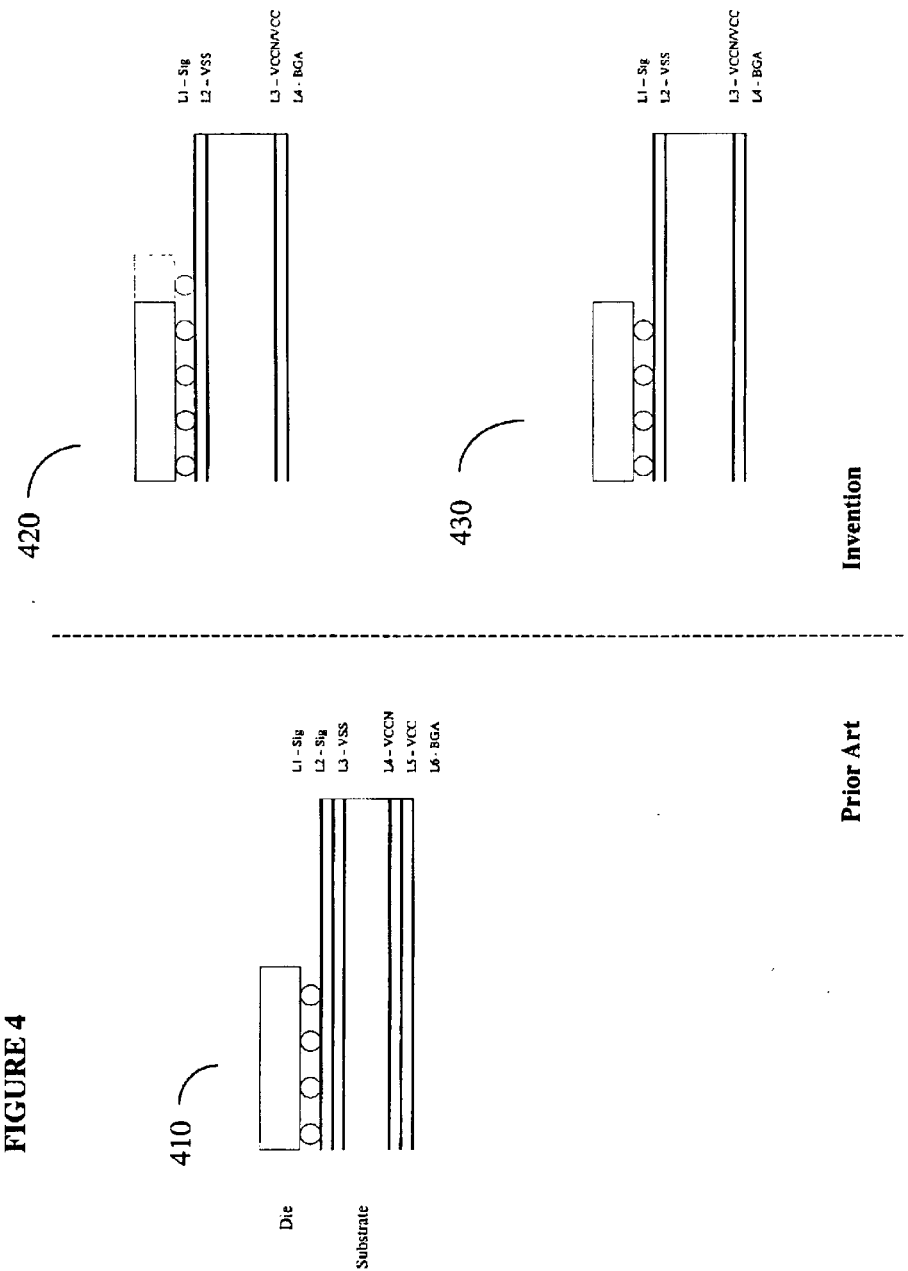
FIG. 4 is a diagram illustrating a reduction in the number of substrate layers because of the pre-routing.

FIG. 4 compares in cross-sectional view a conventional flip-chip package 410 and flip-chip packages 420 and 430 according to one embodiment of the present invention. As shown in FIG. 4, without pre-routing, package 410 uses a device specific 6 layer substrate, including two signal layers L1 and L2, a $V_{SS}$ plane L3, a $V_{CC}$ plane L4, a $V_{CCN}$ plane L5, and a BGA land layer L6. With pre-routing, the six layers of routing in the substrate in package 410 can be reduced to four-layers of routing, as in the substrates in packages 420 and 430. The four layers include layer 1 which is a signal trace layer or microstrip layer, layer 2 which is a $V_{SS}/V_{SSN}$ plane, layer 3 which is a $V_{CC}/V_{CCN}$ plane, and layer 4 which is a BGA land layer. Also, instead of being device specific, the four-layered substrates in package 430 can be a standard substrate with fixed signal trace routing, fixed $V_{SS}$ plane, $V_{CC}/V_{CCN}$ plane, and fixed BGA land layer routing, while still allowing small chip size variation. For larger chip size variation, the four-layered substrate in package 420 can be a semi-standard substrate with device specific signal trace routing but fixed $V_{SS}$ plane, $V_{CC}/V_{CCN}$ plane, and BGA land layer routing. An example of the packaging substrate for package 420 or 430 is a 4-layer 1/2/1 build-up substrate, which includes 2 core metal layers put together using laminate technology and 1 metal layer formed on each side of the 2 core metal layers using build-up technology. The design rules for the 4-layer 1/12/1 build-up substrate are 50($\mu$m)/50($\mu$m) line/space for routing lines beyond the edge of the chip, 30($\mu$m)/30($\mu$m) line/space for routing lines under the chip (die escape), and 75($\mu$m)/125 ($\mu$m) for via/pad. Another example of the packaging substrate for package 420 or 430 is a 4-layer laminate substrate having 4 layers of metal lines put together using laminate technology and design rules of 60/60 line/space for the metal lines and 200/400 for via/pad.

When the pad density is not too high, the pads 312 can be pre-routed to their new locations using a single layer of pre-routing lines 314, and thus conventional pad redistribution processes can be employed for the pre-routing. According to one embodiment of the present invention, the maximum number of pre-routing lines in a single layer that can be placed between vias is about 8 for the 4-layer 1/2/1 build-up substrate and 4 for the 4-layer laminate substrate; the minimum chip size to allow all first layer signal traces routed on the chip is about 14 mm on a side for the 4-layer 1/2/1 build-up substrate and 18 mm for the 4-layer laminate substrate; the maximum number of pre-routing lines in a single layer per millimeter is about 10 for the 4-layer 1/2/1 build-up substrate and 7 for the 4-layer laminate substrate; and the minimum die size to fan out all first signal layer traces is about 13.5 mm for the 4-layer 1/2/1 build-up substrate and 17 mm for the 4-layer laminate substrate. When the pad density is sufficiently high or the chip is too small, multiple layers of pre-routing lines need to be used.

Multiple layers of pre-routing lines may also be used on larger chips so that all traces that do not need to fan out may be pre-routed on-chip to further reduce substrate routing layers. Larger chips may be assembled in this manner in fine-line BGA packages to achieve smaller package body size (or larger die to package ratio) and reduced substrate cost. In one embodiment of the present invention, a 2-layer laminate substrate with 60/60 line/space and 200/400 via/pad can be used to flip-chip package a chip with a size not less than 17 mm on a side using a 256 fine-line BGA with a 1.0 mm BGA pitch, or a chip with a size not less than 14 mm on a side using s 256 fine-line BGA with 0.8 mm BGA pitch. Only two substrate routing layers, a signal layer and a BGA land layer with some signal traces, are required in these cases, and no internal routing planes are needed.

Figure 5A:
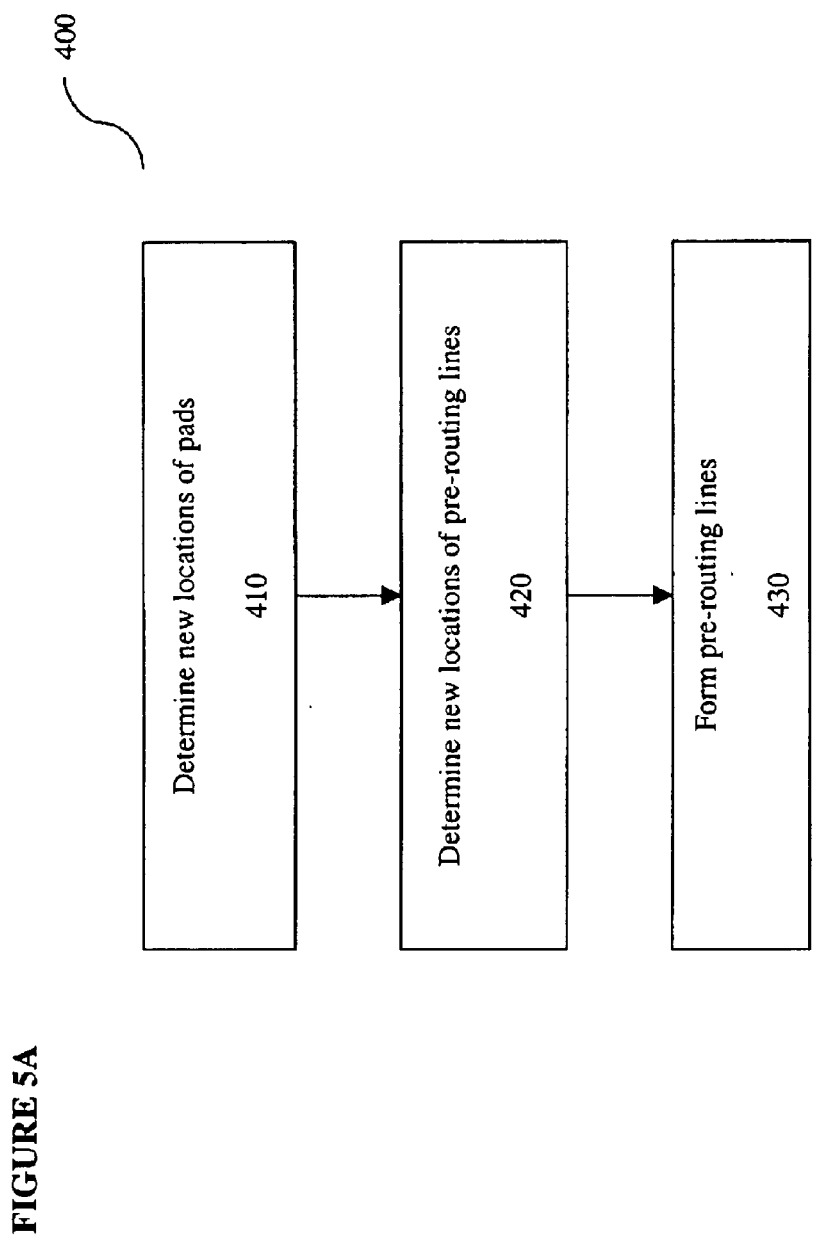
FIG. 5A is a flow diagram of a method of designing wafer-level pre-routing lines to reduce the number of routing layers in a flip-chip packaging substrate according to one embodiment of the present invention.

FIG. 5A is a flow chart illustrating a method 400 for pre-routing a plurality of peripheral pads of an IC chip to new locations on the IC chip, according to one embodiment of the present invention. Method 400 comprises step 410 in which new-locations for at least a portion of the peripheral pads are determined. Some of the new locations are chosen such that when the chip is flip-chip bonded with a substrate, these new locations are within a predetermined horizontal distance from the respective vias or solder balls to which the corresponding pads are designed to be connected. Method 400 further comprises step 420 in which locations of routing lines for routing the peripheral pads to their new locations on the chip are determined based in part on the old and new pad locations and on a line/space requirement for the routing lines, which vary according to different chip package configurations. In one embodiment of the present invention, the line/space requirement for the pre-routing lines is about 10($\mu$m)/20($\mu$m). Method 400 further comprises step 430 for forming the pre-routing lines on the chip. When the pre-routing lines are all in one layer, a conventional thick-metal process can be used to form pre-routing lines that are thicker than 8 $\mu$m, or more preferably, thicker than 10 $\mu$m. When the pre-routing lines are in multiple layers, some form of planarization may be required, as discussed below.

Figure 5B:
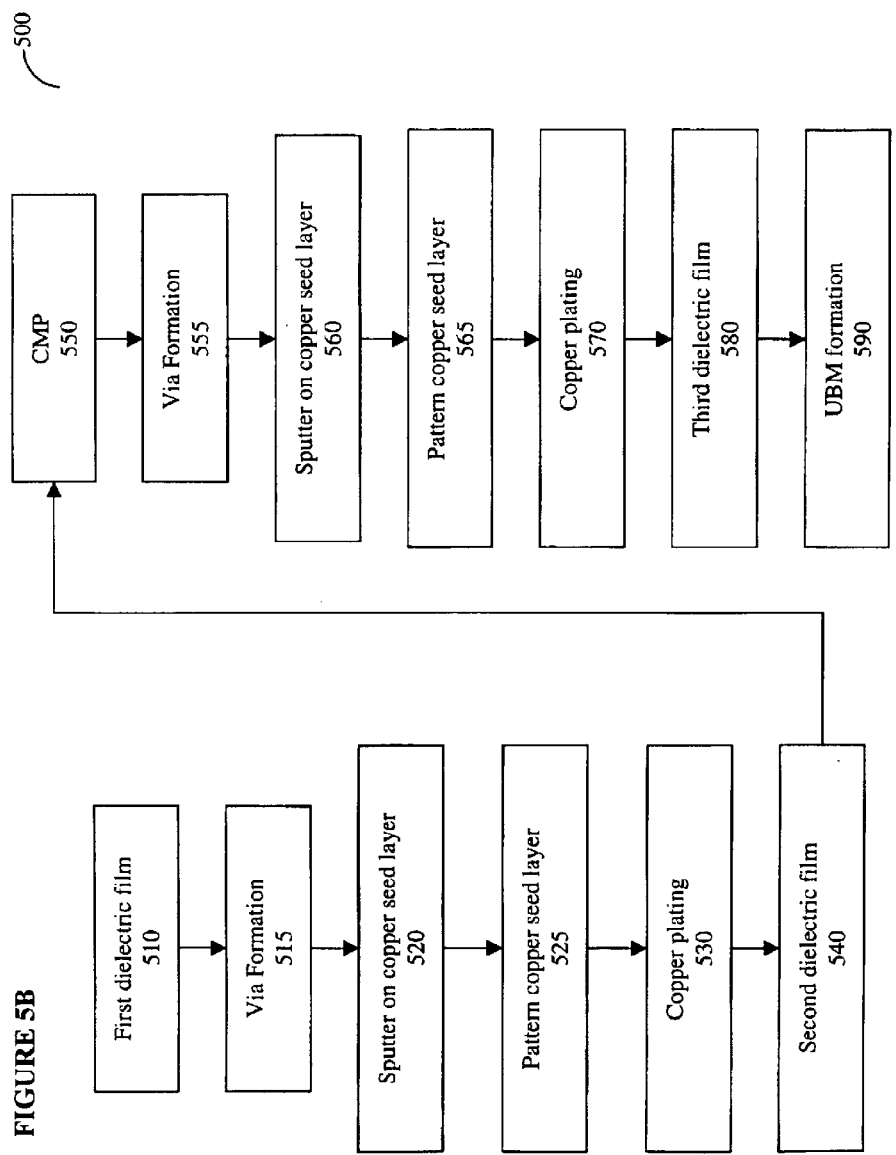
FIG. 5B is a flow diagram of a process for forming multiple layers of pre-routing metal lines at wafer-level according to one embodiment of the present invention.

FIG. 5B is a flow chart illustrating a process 500 for forming more than one layer of pre-routing lines according to one embodiment of the present invention. Process 500 is performed at wafer level after passivation and comprises step 510 where a first dielectric film is put on top of the passivation layer by stencil plating or screen printing, leaving the pads exposed. Alternatively, the first dielectric film is formed on the passivation layer at step 510 without exposing the original pads, and a step 515 is required to form the vias through the first dielectric film to expose the original pads. Process 500 further comprises step 520, in which a copper seed layer is sputtered on the wafer. At step 525 the copper seed layer is patterned to define a first layer of pre-routing lines and first-layer new pads. The patterning can be done by photo masking and subsequent etching. Then at step 530, copper routing lines with a thickness of at least 8 $\mu$m, or more preferably, at least 10 $\mu$m, are formed on the copper seed layer using copper plating. Process 500 further comprises step 540, in which a second dielectric film is put on the wafer by stencil plating or screen printing, and step 550, in which the second dielectric film is planarized using a planarization process such as chemical mechanical planarization (CMP). Process 500 may further comprise step 555, in which vias are formed in the dielectric film to expose first layer new pad locations. Thereafter, steps 520 to 540 are repeated to form a second layer of pre-routing lines running from first-layer new pad locations to second-layer new pad locations. At the end of process 500, under bump metalization (UMB) is formed on the second-layer new pads before a bump array is formed on the second-layer new pads.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A semiconductor device, comprising:
   an integrated circuit chip having a plurality of pads, and pre-routing lines that route at least a portion of the pads to new pad locations on the chip;
   a packaging substrate having a first side for bonding with the chip, solder pads on a second side for attaching a grid array of solder balls, and vias between the first side and the second side for providing electrical connection between the pads on the chip and solder pads on the substrate; and
   wherein the new pad locations on the chip are chosen such that when the chip is bonded with the substrate, the new pad location for each pad is within a predetermined horizontal distance from a center of a respective via or solder pad to which the pad on the chip is designed to be connected, the predetermined horizontal distance being less than the diameter of a solder pad.

2. The semiconductor device of claim 1 wherein the pre-routing lines are in multiple layers on the integrated circuit chip.

3. The semiconductor device of claim 1 wherein the pre-routing lines are at least 8 $\mu$m thick.

4. The semiconductor device of claim 1 wherein the packaging substrate includes two layers of conductive routing lines for connecting the pads on the chip to respective vias or solder balls to which the pads are designed to connect, the two layers of conductive routing lines including a signal layer and a ball grid array land layer with some signal trace routing.

5. The semiconductor device of claim 1 wherein the packaging substrate has 4 layers of conductive routing lines for connecting the pads on the chip to respective vias or solder balls to which the pads are designed to connect.

6. The semiconductor device of claim 5 wherein the four layers of conductive routing lines include a signal trace layer, a $V_{SS}/V_{SSN}$ layer, a $V_{CC}/V_{CCN}$ layer, and a ball grid array land layer.

7. The semiconductor device of claim 5 wherein the packaging substrate is a 4-layer 1/2/1 build-up substrate.

8. The semiconductor device of claim 5 wherein the packaging substrate is a 4-layer laminate substrate.

9. The semiconductor device of claim 1 wherein the predetermined horizontal distance is less than half the diameter of the solder pads.

10. The semiconductor device of claim 1 wherein the pre-routing lines are made of metal.

11. The semiconductor device of claim 1 wherein the pre-routing lines are made of copper.

12. The semiconductor device of claim 1 wherein each pre-routing line has a width of at least 10 $\mu$m and the pre-routing lines are spaced at least 20 $\mu$m from each other.

13. The semiconductor device of claim 1 wherein the pre-routing lines include signal traces.

14. A integrated circuit chip for bonding with a packaging substrate, the packaging substrate having a first side for bonding with the chip, solder pads on a second side for attaching a grid array of solder balls, and vias between the first side and the second side, the integrated circuit chip comprising:
   a plurality of peripheral pads under a passivation layer;
   a plurality of new pads over the passivation layer; and
   pre-routing lines over the passivation layer, the pre-routing lines connect at least a portion of the peripheral pads to the new pads; and
   wherein, when the integrated circuit chip is bonded with the packaging substrate, each new pad is located within a predetermined horizontal distance from a respective via or solder pad to which a corresponding peripheral pad connected to the new pad by a routing line is designed to be connected, the predetermined horizontal distance being less than the diameter of the solder pad.

15. The semiconductor device of claim 14 wherein the pre-routing lines are at least 8 $\mu$m thick.

16. A semiconductor device, comprising:
   an integrated circuit chip having a plurality of pads, and pre-routing lines that route at least a portion of the pads to new pad locations on the chip; and
   a packaging substrate having a first side for bonding with the chip, solder pads on a second side for attaching a grid array of solder balls, and vias between the first side and the second side for providing electrical connection between the pads on the chip and solder pads on the substrate; and wherein the pre-routing lines are at least 8 micron thick.

17. The semiconductor device of claim 16 wherein the new pad locations on the chip are chosen such that when the chip is bonded with the substrate, the new pad location for each pad is within a predetermined horizontal distance from a center of a respective via or solder pad to which the pad on the chip is designed to be connected, the predetermined horizontal distance being less than the diameter of a solder pad.

18. The semiconductor device of claim 17 wherein the predetermined horizontal distance is less than half the diameter of the solder pads.

19. The semiconductor device of claim 16 wherein the pre-routing lines are in multiple layers on the integrated circuit chip.

20. The semiconductor device of claim 16 wherein the pre-routing lines are made of metal.

21. The semiconductor device of claim 16 wherein the pre-routing lines are made of copper.

22. The semiconductor device of claim 16 wherein each pre-routing line has a width of at least 10 $\mu$m and the pre-routing lines are spaced at least 20 $\mu$m from each other.

23. The semiconductor device of claim 16 wherein the pre-routing lines include signal traces.

* * * * *